United States Patent
Jain et al.

(10) Patent No.: US 7,187,228 B1
(45) Date of Patent: Mar. 6, 2007

(54) METHOD OF PROGRAMMING AN ANTIFUSE

(75) Inventors: Rajiv Jain, Palo Alto, CA (US); Richard J. Wong, Saratoga, CA (US)

(73) Assignee: Quicklogic Corporation, Sunnyvale, CA (US)

( * ) Notice: Subject to any disclaimer, the term of this patent is extended or adjusted under 35 U.S.C. 154(b) by 1039 days.

(21) Appl. No.: 09/887,834

(22) Filed: Jun. 22, 2001

(51) Int. Cl.
*H01H 37/76* (2006.01)
(52) U.S. Cl. .................................... 327/525
(58) Field of Classification Search .............. 327/525, 327/526
See application file for complete search history.

(56) References Cited

U.S. PATENT DOCUMENTS

| | | | |
|---|---|---|---|
| 5,243,226 A | 9/1993 | Chan | 326/38 |
| 5,361,001 A * | 11/1994 | Stolfa | 327/312 |
| 5,434,498 A * | 7/1995 | Cordoba et al. | 323/313 |
| 6,169,416 B1 * | 1/2001 | Eaton et al. | 326/38 |
| 6,307,423 B1 * | 10/2001 | Morton | 326/49 |

\* cited by examiner

*Primary Examiner*—Timothy P. Callahan
*Assistant Examiner*—Hai L. Nguyen
(74) *Attorney, Agent, or Firm*—Silicon Valley Patent Group LLP

(57) ABSTRACT

An antifuse, which has a programmable material disposed between two conductive elements, is programmed using multiple current pulses of opposite polarity. The first pulse has a current that is insufficient to fully program the antifuse, i.e., produce a desired level of resistance. In one embodiment the first pulse is current limited. The first pulse advantageously drives a conductive filament from one conductive element through the antifuse material, which may be, e.g., amorphous silicon. The conductive filament from the first pulse, however, has a limited cross sectional area. A programming pulse having the same voltage with opposite polarity and a current with increased magnitude is used to drive material from the other conductive element into the antifuse material, which increases the cross sectional area of the conductive filament thereby reducing resistance. Additional programming pulses, as well as current limited pulses, may be used if desired. Programming an antifuse in accordance with the present invention results in an antifuse structure with a conductive filament that is in good contact with both conductive elements, which reduces resistance in the antifuse and increases yield. A programming circuitry is provided that includes a current source and a voltage clamp to program antifuses according the described method.

25 Claims, 9 Drawing Sheets

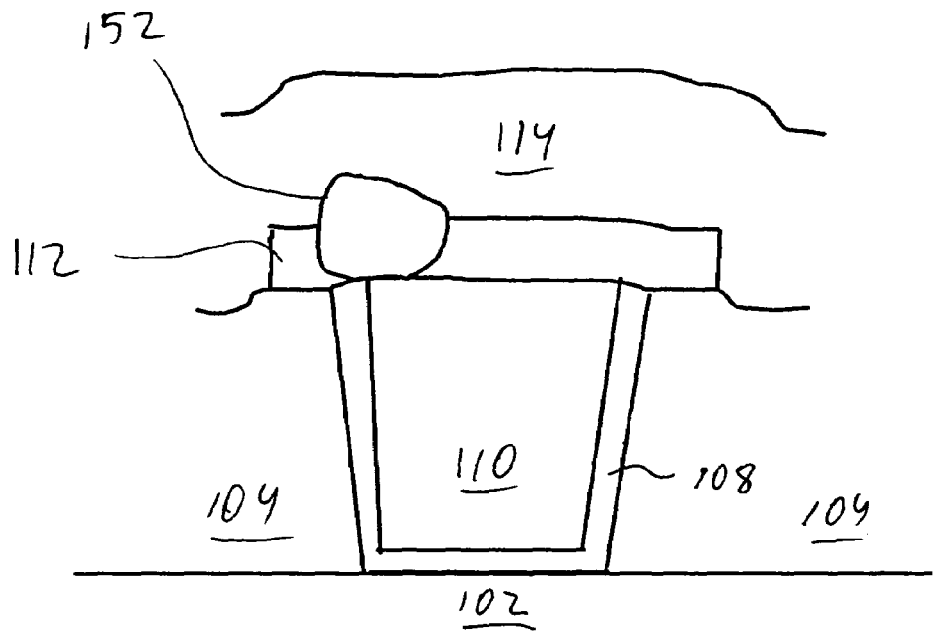
Fig 11
(Conventional)
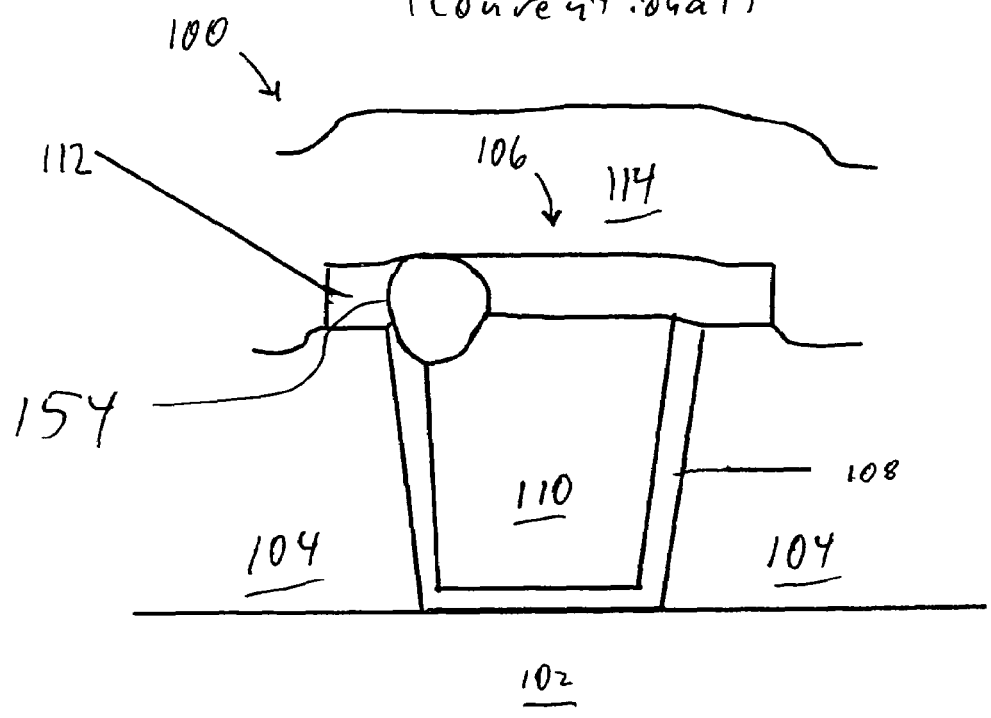
Fig 12
(Conventional)

METHOD OF PROGRAMMING AN ANTIFUSE

FIELD OF THE INVENTION

The present invention relates to electrical devices, and more particularly to methods and circuits for programming antifuses.

BACKGROUND

Programmable semiconductor devices include programmable read only memories ("PROMs"), programmable logic devices ("PLDs"), and programmable gate arrays. One type of programmable element suitable for one or more of these device types is an antifuse.

An antifuse is a structure which when unprogrammed does not electrically couple its first and second electrodes, but which, when programmed, permanently electrically couples the first and second electrodes. An antifuse is programmed by applying sufficient voltage ("programming voltage") between its first and second electrodes. One type of antifuse comprises a high resistivity material in which a low resistivity filament is formed when the material is heated by electrical current. Amorphous silicon, silicon dioxide and silicon nitride have been used successfully as the high resistivity materials. See, for example, U.S. Pat. No. 4,823,181 issued Apr. 18, 1989 to Mohsen et al.; U.S. Pat. No. 5,557,136 issued Sep. 17, 1996 to Gordon et al; U.S. Pat. No. 5,308,795 issued May 3, 1994 to Hawley et al.; U.S. Pat. No. 5,233,217 issued Aug. 3, 1993 to Dixit et al.; U.S. Pat. No. 6,107,165 issued Aug. 22, 2000 to Jain et al.; B. Cook et al., "Amorphous Silicon Antifuse Technology for Bipolar PROMs," 1986 Bipolar Circuits and Technology Meeting, pages 99–100.

An antifuse, when programmed, should have a low resistance, particularly because a programmable device will typically include many programmed antifuses. It was generally believed that in order to obtain lower resistance one needs to raise "programming" current (the current passing through the antifuse during programming). Namely, the physics of antifuse programming was believed to be as follows. When the programming voltage is applied between the antifuse terminals, the high resistivity material breaks down at its weakest portion. Current flows through that portion and heats the material. The heat creates a conductive filament through the material. As the filament grows in size, the resistance across the material decreases. Hence, the temperature of the material also decreases. Gradually the temperature becomes so low that the conductive filament stops growing. See Hamdy et al., "Dielectric Based Antifuse for Logic and Memory ICs," IEDM 1988, pages 786–789. In order to reduce the resistance further, the current has to be increased to generate more heat.

As discussed in U.S. Pat. No. 5,243,226, issued Sep. 7, 1993, to Chan, which is incorporated herein by reference, the resistance in a programmed antifuse is decreased if the antifuse is programmed using multiple current pulses having opposite polarity. Namely, a first programming current pulse is followed by a second pulse in the opposite direction. The first pulse programs the antifuse, i.e., drives a conductive filament from one electrode, through the programmable material and into contact with the other electrode. The second pulse reduces the resistance even if the first pulse was of such duration that the resistance stopped decreasing during the first pulse. Further, the second pulse reduces the resistance even though the magnitude of the second pulse current is not larger than the magnitude of the first pulse current. As discussed in U.S. Pat. No. 5,243,226, the best results were believed to be achieved if the magnitude of the second pulse is lower than the magnitude of the first pulse. Thus, for example, it was believed that the second pulse provided a significant reduction in resistance for a greater number of antifuses if the second pulse is 20–25% lower in magnitude than the first pulse.

Due to the large number of antifuses that must be programmed in a conventional programmable device, there is a desire to reduce the resistance in a programmed antifuse and to reduce the risk that any particular antifuse will not be programmed, i.e., increase the yield of programmed antifuses.

SUMMARY

An antifuse is programmed, in accordance with the present invention, using multiple pulses of opposite polarity. The first pulse does not fully program the antifuse, i.e., produce the desired resistance level, but drives a conductive filament from a first conductive element into the programmable material of the antifuse. The conductive filament produced by the first pulse, however, has a limited cross sectional area. The first pulse is followed by a second pulse that drives material from the second conductive element into the antifuse material, which increases the cross sectional area of the conductive filament, thereby reducing resistance. In one embodiment, the second pulse has the same voltage with opposite polarity as the first pulse and has a greater magnitude current than the first pulse. Additional programming pulses, similar to the second pulse in voltage and current (or reduced current) with opposite polarity as the preceding pulse, may be used if desired to further reduce resistance in the antifuse. In another embodiment, multiple pulses similar to the first pulse, but with opposite polarity and each having a current insufficient to fully program the antifuse, may be used to partially program the antifuse. Programming an antifuse in accordance with the present invention results in an antifuse structure with a conductive filament that is in good contact with both conductive elements, which reduces resistance in the antifuse and increases yield.

Thus, while the first pulse in a conventional programming method uses a full current to drive a conductive filament from one conductive element, through the programmable material, and into contact with the other conductive element, the present invention limits the current of the first pulse. The first pulse, according to the present invention, is used to form a conductive filament from the first conductive element with a limited cross sectional area. A subsequent pulse, which may have full current, is used to drive material into the antifuse material from a second conductive element thereby increasing the cross sectional area of the antifuse. Consequently, the programmed antifuse of the present invention has a conductive filament that originated from both conductive elements, which ensures solid electrical contact between the conductive elements. Conventional programming methods, on the other hand, form a conductive filament from one conductive element with a full cross sectional area with the first pulse. Additional pulses according to conventional programming methods do not significantly increase the cross sectional area of the conductive filament and thus material from the second conductive element is not driven into the antifuse material. Consequently, the contact with the second conductive element may be weak in which case the antifuse will have a higher than desired resistance.

This summary does not purport to describe all the features of the invention. Other features and aspects of the invention are described below. The invention is defined by the appended claims.

BRIEF DESCRIPTION OF THE DRAWINGS

FIGS. 11 and 12 show the antifuse of FIG. 1, which has been conventionally programmed top-down and bottom-up, respectively.

DETAILED DESCRIPTION

Figure 1:
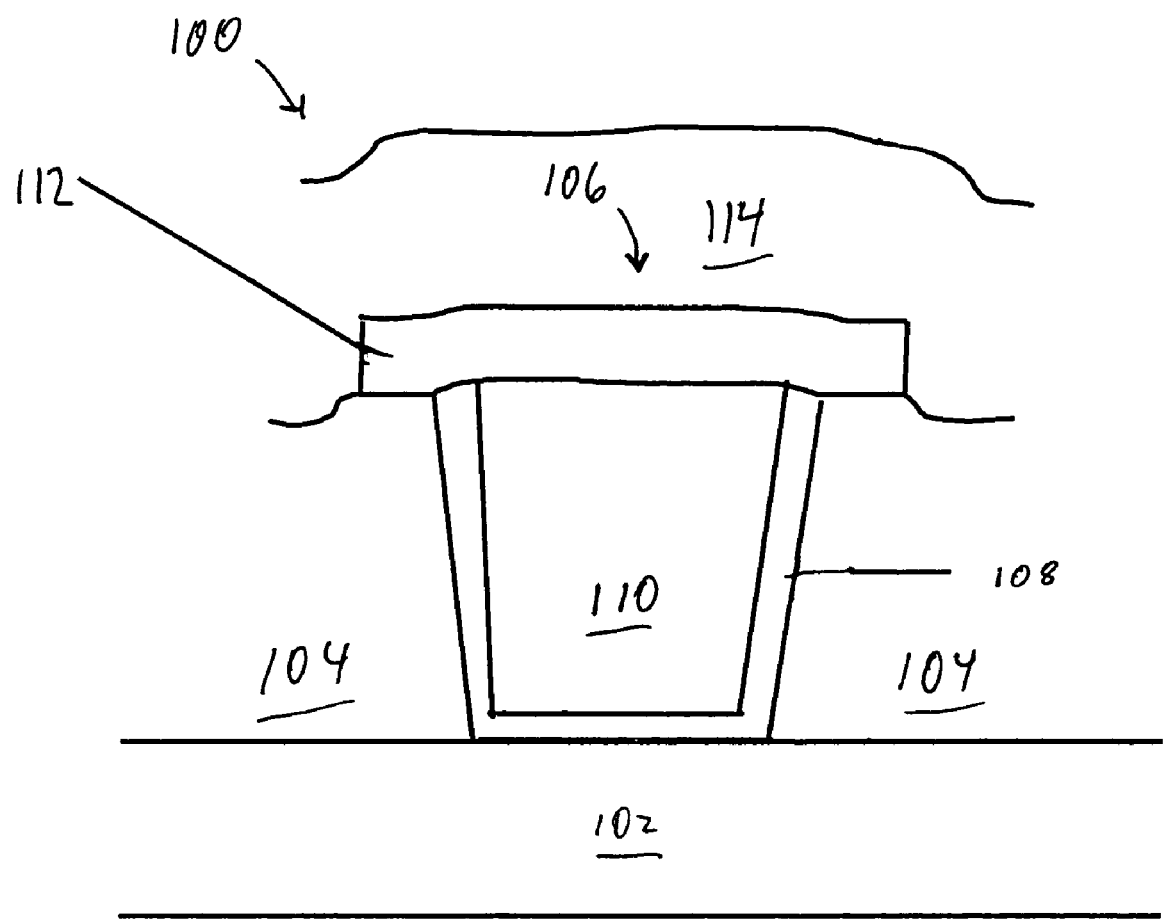
FIG. 1 shows a side view of an antifuse that may be programmed by the method of the present invention.

FIG. 1 shows a side view of an antifuse 100 that may be programmed by the method of the present invention. Antifuse 100 is described in detail in U.S. Pat. Nos. 5,557,136, 5,308,795, 5,233,217, and 6,107,165, which are incorporated herein by reference.

As shown in FIG. 1, antifuse 100 includes a bottom electrode 102, which is formed over a dielectric layer (not shown), which in turn is formed on a substrate (not shown). The bottom electrode 102 may be a metal (or an alloy) layer, comprised of titanium nitride, copper, tungsten, aluminum or other appropriate material. A second dielectric layer 104, e.g., oxide, is deposited on bottom electrode 102 and a via 106 is etched through second dielectric layer 104. The via 106 is filled with a conductive plug 110, which may be, e.g., tungsten. The sidewalls of via 106 are covered with, e.g., titanium nitride 108. A programmable material, e.g., amorphous silicon layer 112, is deposited over the tungsten plug 110 and titanium nitride sidewalls 108. The top electrode 114, which may be made of a material similar to the bottom electrode 102, is deposited over amorphous silicon layer 112 and the second dielectric layer 104. Top electrode 114 and bottom electrode 102 are connected to programming circuitry (not shown) that programs antifuse 100. In the 0.25 µm process, the tungsten plug 110 is approximately 1 µm high and 0.36 µm per side and antifuse 100 may be 1.12 µm, so that it extends approximately 0.38 µm over each side of tungsten plug 110. In other embodiments, the programmable material in antifuse 100 may be directly coupled to bottom electrode 102, i.e., there is no conductive plug 110, e.g., as described in U.S. Pat. No. 5,243,226. Thus, amorphous silicon layer 112 is disposed between and electrically coupled to two conductive elements, top electrode 114 and conductive plug 110 (or bottom electrode 102 if conductive plug 110 is not used). It should be understood that one of the conductive elements may include both conductive plug 110 and sidewalls 108, which contact amorphous silicon layer 112, but that for the sake of simplicity, only conductive plug 110 will be referred to as the conductive element.

Figure 2:
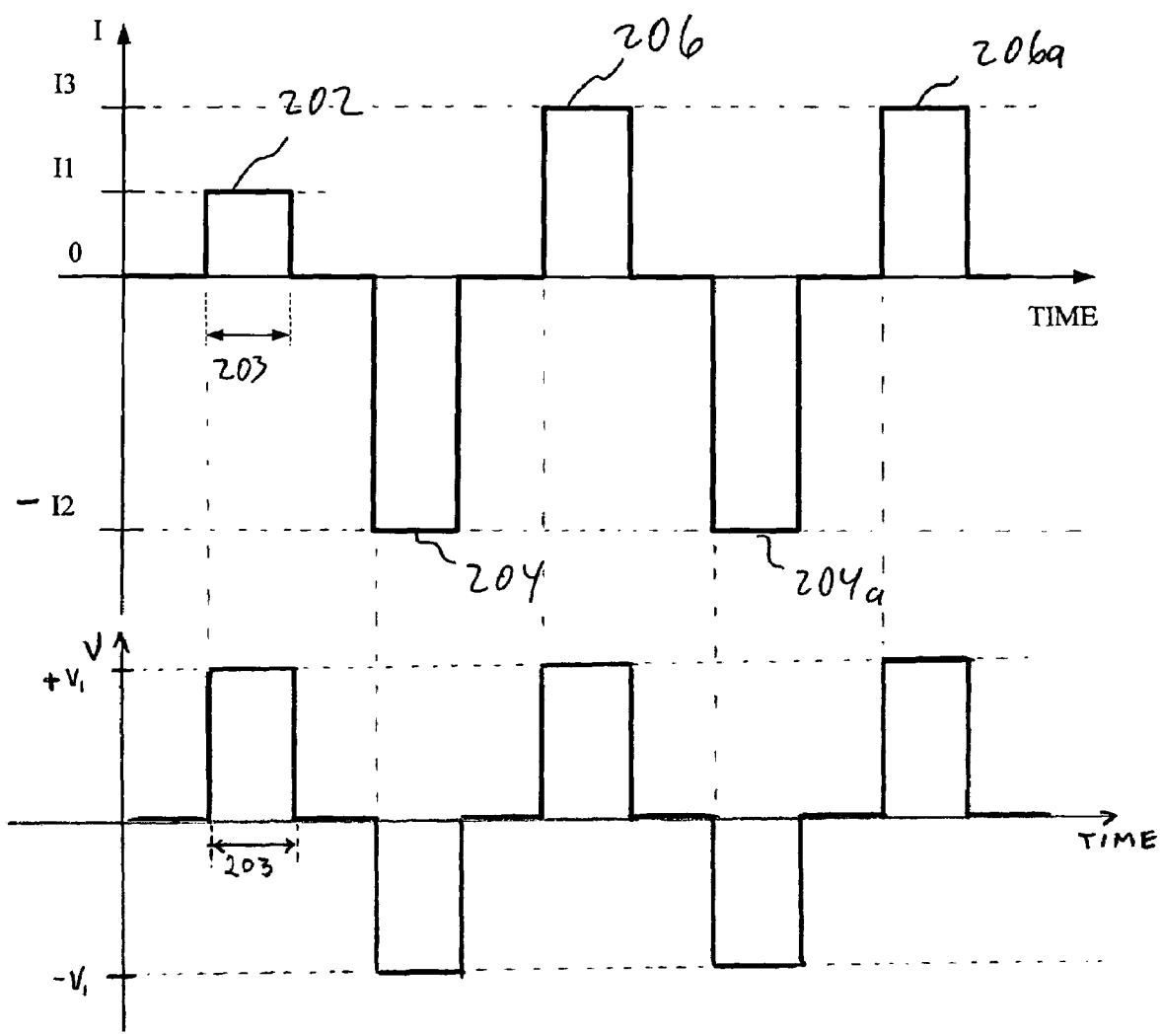
FIG. 2 shows a programming current that may be used in accordance with an embodiment of the present invention to program an antifuse.

In accordance with an embodiment of the present invention, antifuse 100 is programmed by applying the programming pulses shown in FIG. 2. The programming pulses shown in FIG. 2 are similar to that disclosed in U.S. Pat. No. 5,243,226, which is incorporated herein by reference, with the addition of a full voltage, current limited prepulse 202 that precedes the conventional programming pulses and is therefore referred to herein as "prepulse" 202. Prepulse 202 is used to partially program the antifuse 100 prior to applying the conventional programming pulses.

The current in the pulses shown in FIG. 2 is created by applying voltages to top electrode 114 and bottom electrode 102. For example, the prepulse 202 is generated by causing top electrode 114 to be at a higher voltage than bottom electrode 102. In one example, the prepulse 202 is generated with the top electrode 114 at 7.5V and the bottom electrode 102 at ground for a 0.25 µm architecture antifuse. Pulse width 203 may be 10 ms, but may be longer or shorter if desired. The current I1 of the prepulse 202 is current limited to, e.g., 1 mA to 5 mA, and is preferably 4 mA to 5 mA.

Figure 3:
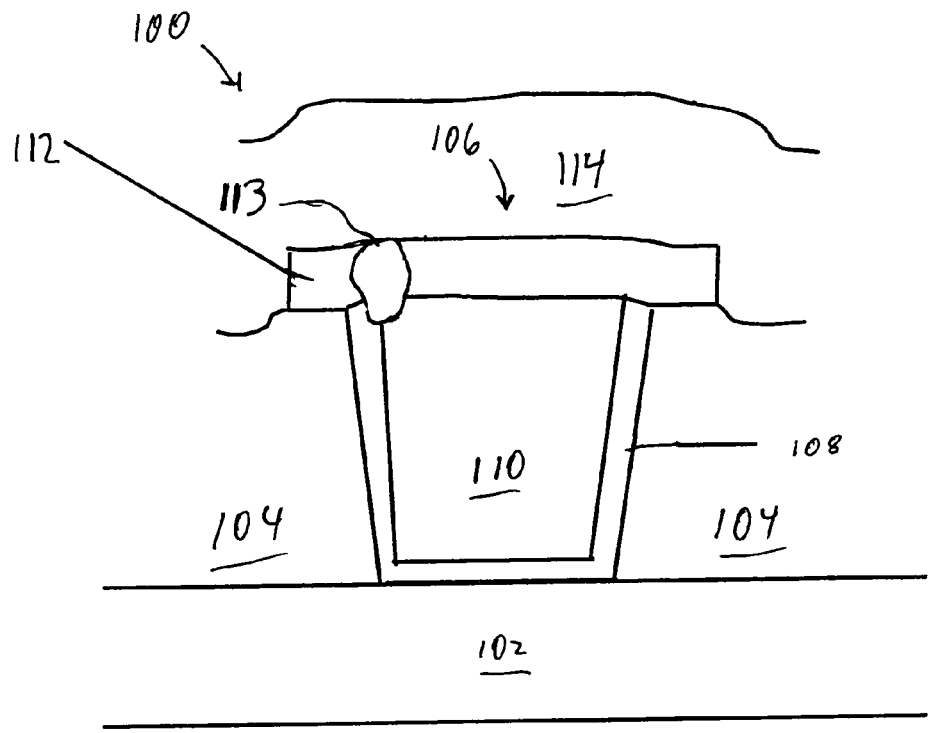
FIG. 3 shows the antifuse of FIG. 1 with a conductive filament with a limited cross sectional area formed through the programmable material of the antifuse.

Current I1 of prepulse 202 drives a small conductive filament through the amorphous silicon 112. FIG. 3 shows antifuse 100 with a conductive silicide filament 113 formed through amorphous silicon 112. The cross sectional area of the conductive filament is proportional to the current. Because current I1 of prepulse 202 is current limited, the conductive filament 113 formed by prepulse 202 will have a relatively limited cross sectional area compared to the cross sectional area of the conductive filament 113 after programming is finished. The electrode material moves in the direction of the electron flow, from the negative electrode to the positive electrode, and reacts with the amorphous silicon to form a metal silicide. Thus, because conductive plug 110 is the negative electrode, conductive filament 113 will be a tungsten silicide filament.

As shown in FIG. 2, a second pulse 204 of opposite polarity of the prepulse 202 is then generated by causing bottom electrode 102 to be at a higher voltage than top electrode 114. For example, bottom electrode 102 may be at 7.5V while top electrode 114 is held at ground to generate pulse 204. The width of pulse 204 may be the same as that of prepulse 202, if desired. The current I2 of pulse 204 need not be limited as with the prepulse 202 and, thus, may be the full programming current, e.g., 12 mA to 17 mA. It has been found that the best results occur when the current I1 of the prepulse 202 is 20% to 35% of the current I2 of the pulse 204. Because prepulse 202 was current limited, the conductive filament 113 did not reach its maximum cross sectional area. The higher current of pulse 204 causes the conductive filament to increase in cross sectional area. Consequently, pulse 204 can move additional material into the conductive filament. Because pulse 204 has the opposite polarity of prepulse 202, top electrode 114 is the negative electrode and thus material from top electrode 114, e.g., titanium, will move into the conductive filament 113 and react with the amorphous silicon to form a metal silicide, e.g., titanium silicide.

Figure 4:
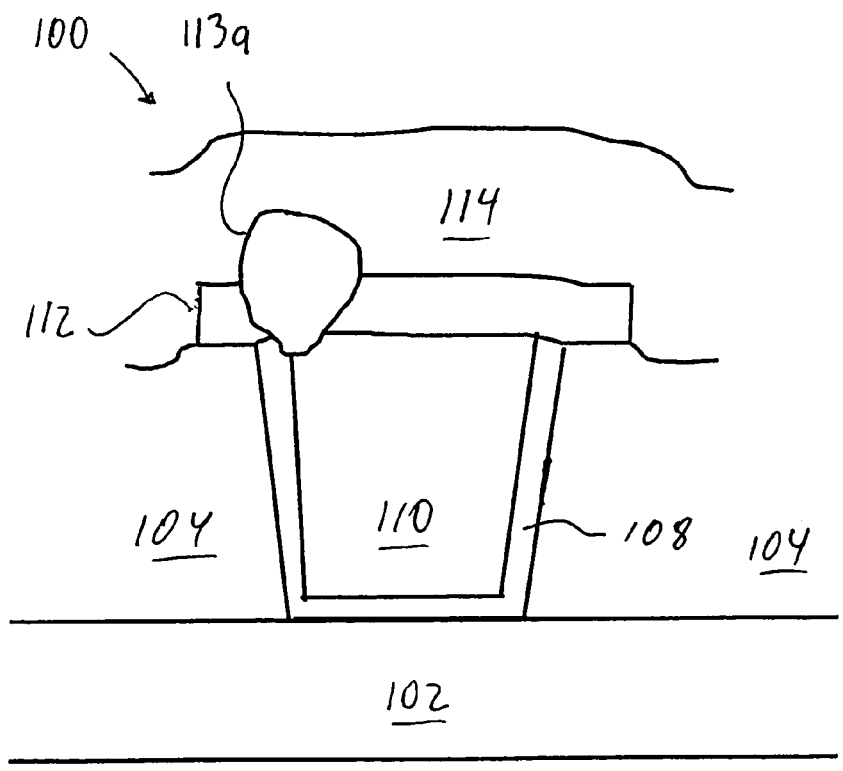
FIG. 4 shows the antifuse of FIG. 1 with a conductive filament with a full size cross sectional area formed through the programmable material of the antifuse.

FIG. 4 shows antifuse 100 with the final conductive silicide filament 113a formed through amorphous silicon 112. As can be seen, the final conductive filament 113a has an increased cross sectional area relative to the conductive filament 113 (shown in FIG. 3) formed only by prepulse 202. The final cross sectional area of conductive filament 113a is approximately the same as the cross sectional area of a filament that is conventionally formed, i.e., without prepulse 202. However, conductive filament 113a, which was partially formed by prepulse 202 and increased in size by pulse 204, has electrode material from both the top and the bottom electrodes incorporated into the silicide filament. Thus, conductive filament 113a extends into top electrode 114 and extends down into conductive plug 110. The extension of the conductive filament 113a into both the top and bottom electrodes, e.g., the top electrode 114 and into the conductive plug 110, is advantageous because it ensures good contact between the top electrode 114 and conductive plug 110 through amorphous silicon 112, which leads to a lower resistance in antifuse 100, as well as reducing the risk that antifuse 100 will become more resistive because of poor contact between the conductive filament and a conductive element.

Conventionally formed filaments, by way of comparison, include material from only one electrode. FIGS. 11 and 12 show sideviews of antifuse 100 after being conventionally programmed top-down and bottom-up, respectively. As shown in FIG. 11, anti fuse 100 has a silicide 152, e.g., a titanium silicide, that extends from the top electrode 114 down and contacts conductive plug 110, which is caused by the initial pulse having full programming current and by applying a low voltage to the top electrode 114 and a high voltage to the bottom electrode 102. As shown in FIG. 11, however, conductive filament 152 does not extend into the bottom electrode, i.e., plug 110, but merely contacts plug 110. Because the initial programming pulse that drove silicide 152 through amorphous silicon 112 was at full current, the cross sectional area of filament 152 after the initial programming pulse is full sized. Consequently, if initial programming pulse is followed by a programming pulse of opposite polarity, the resulting structure has little or no change, i.e., little or no material from the conductive plug 110 is driven into conductive filament 152 and, thus, the conductive filament 152 does not extend into the bottom electrode in a significant manner. Unfortunately, conductive filament 152 may not always make solid contact with conductive plug 110, which may cause higher resistance in antifuse 100, or make the antifuse 100 less stable.

FIG. 12 is similar to FIG. 11 and shows antifuse 100 after being programmed bottom-up, i.e., with the initial pulse having a low voltage on bottom electrode 102 and a high voltage on top electrode 114. The conductive silicide filament 154, which may be a tungsten or tungsten rich silicide, that forms extends from tungsten plug 110 and contacts top electrode 114. As discussed above, subsequent programming pulses will have little affect on the structure of the conductive filament 154 because the filament is already at maximum size after the initial programming pulse. Consequently, conductive filament 154 merely contacts and does not extend into top electrode 114, which may result in unacceptably high resistance.

As shown in FIG. 2, additional pulses may be used to reduce the resistance of the programmed antifuse 100 as described in U.S. Pat. No. 5,243,226. Thus, for example, a third pulse 206 may be generated with the same polarity as initial prepulse 202, i.e., the top electrode 114 is at a high voltage, e.g., 7.5V, while the bottom electrode 102 is at a low voltage, e.g., ground. The pulse width of the third pulse 206 may be the same as width 203 if desired. The current I3 of pulse 206 is lower in magnitude than current I2 of the second pulse 204. Desirably, the magnitude of current I3 is below the magnitude of current I2 by 20% to 25%. Thus, the current I3 may vary between, e.g., 9 mA to 14 mA. Because the subsequent pulses produce the same or less current than in pulse 204, there is no major movement of electrode material.

If desired, the resistance of antifuse 100 may be reduced further by repeating pulses 204 and 206, as shown in FIG. 2 as pulses 204a and 206a. Because the antifuse 100 is already programmed, the prepulse 202 does not need to be repeated. Pulses 204a and 206a reduce both the mean and the standard deviation of the antifuse resistance. Further reduction in the resistance and the standard deviation of resistance in antifuse 100 is achieved under certain circumstances by repeating the pair of pulses 204 and 206 a number of times.

It should be understood that the polarity of the pulses shown in FIG. 2 may be reversed. Further, it should be understood that prepulse 202 may be used with other programming schemes. For example, prepulse 202 may be used with other current limited prepulses. The programming voltage of an antifuse can be variable and dependent on polarity, i.e., a high voltage in one polarity may not be able to program the antifuse, while the same voltage with opposite polarity may program the antifuse. Thus, if desired, prepulse 202 may be used with additional prepulses having opposite polarity.

Figure 5A:
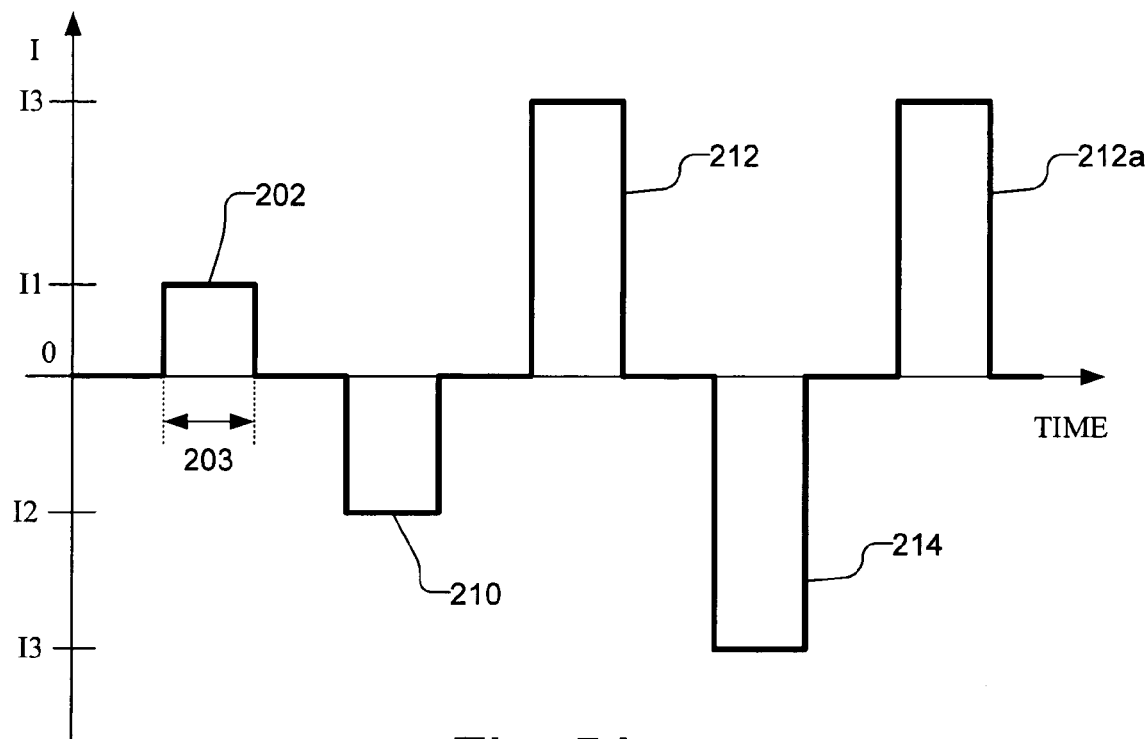
FIGS. 5A and 5B show another embodiment of the programming current that may be used to program an antifuse.
Figure 5B:
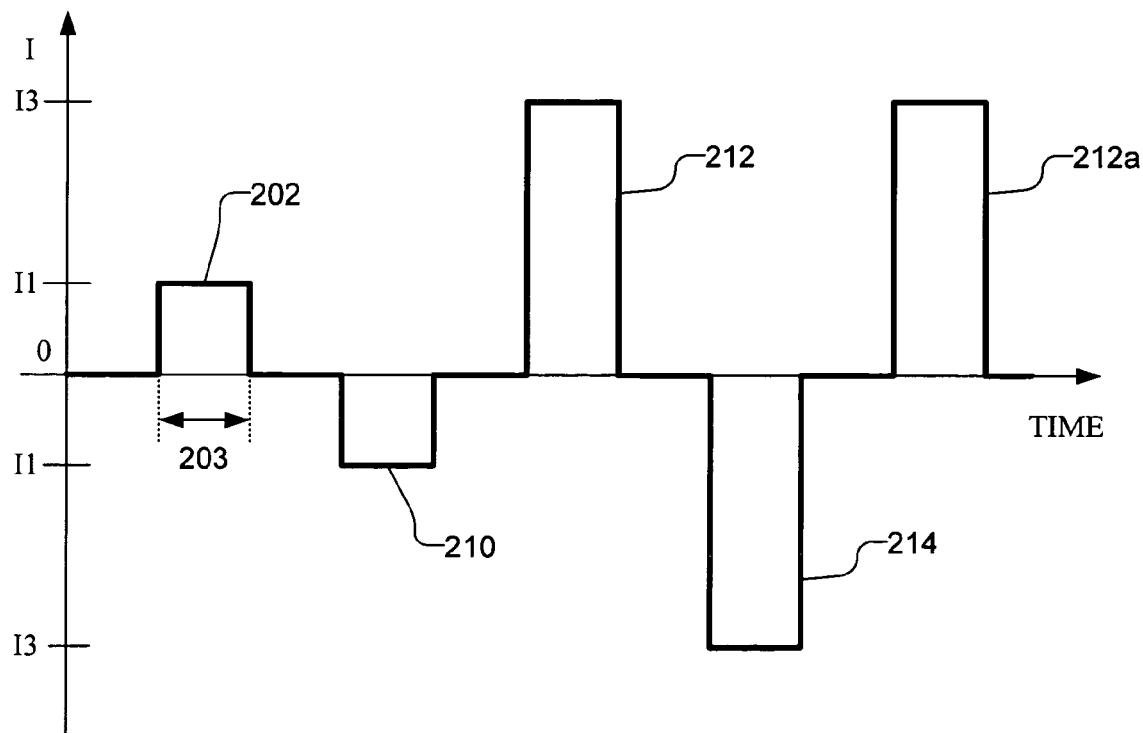

FIGS. 5A and 5B show programming pulses that include a plurality of current limited prepulses that may be used to program antifuse 100 in accordance with another embodiment of the present invention. As shown in FIGS. 5A and 5B, an initial prepulse 202, which is at full voltage and is current limited, is used to move the conductive filament 113 into amorphous silicon 112. A second prepulse 210, which has opposite polarity, follows prepulse 202. The second prepulse 210 may have the same, less, or greater magnitude current as the initial prepulse 202 and e.g., has a current I2 that is limited to 3 mA to 7 mA. It should be understood that while two prepulses, i.e., prepulses 202 and 210, are shown in FIGS. 5A and 5B, any desired number of prepules maybe used.

A third pulse 212, which is at full voltage, is generated with the same polarity as the prepulse 202, but is at full programming current I3, which is approximately 12 mA to 17 mA. If desired, another non-current limited fourth pulse 214 may be produced with an opposite polarity to the third pulse 212. Thus, the magnitude of the current of the fourth pulse 214 is I3, e.g., 12 mA to 17 mA, but is opposite in polarity of the current of the third pulse 212. The same voltage, e.g., 7.5V, is applied for each pulse as described above in reference to FIG. 2.

As discussed above, if desired, the resistance of antifuse 100 may be reduced further by repeating the non-current limited pulses 212 and/or 214. FIGS. 5A and 5B show pulse 212 repeated as pulse 212a.

Figure 6:
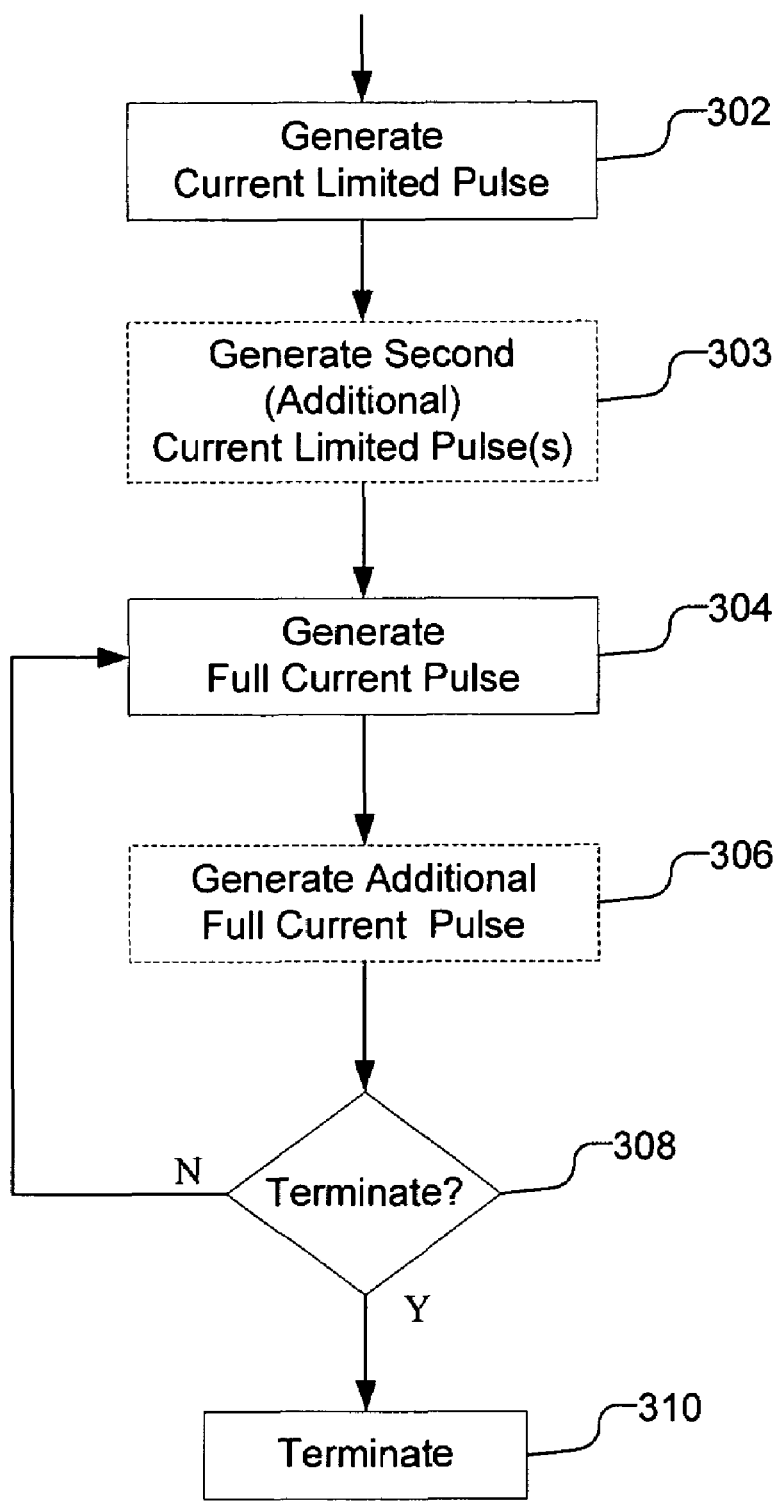
FIG. 6 is a flowchart of one embodiment of the antifuse programming method.

FIG. 6 is a flowchart of one embodiment of the antifuse programming method described above. At step 302, a full voltage, current limited prepulse is generated across antifuse 100 to partially program antifuse 100. Thus, e.g., a high voltage is applied to top electrode 114 relative to bottom electrode 102 and the current is limited. In one embodiment, indicated by broken lines around step 303, a plurality of current limited pulses are generated, e.g., a second full voltage, current limited pulse is generated with opposite polarity from the initial current limited pulse. If desired, additional current limited pluses may be generated, e.g., each having the opposite polarity from the preceding current limited pulse.

At step 304, a full voltage, full current pulse is generated across antifuse 100 to finish programming antifuse 100, i.e., the full size cross sectional area of the conductive filament is provided. At step 306, an additional full voltage, full current pulse is generated. In one embodiment, only the initial pulse from step 202 (and optionally the pulse from step 303) and the pulse from step 204 are used to program antifuse 100 and, accordingly, the pulse in step 306 is not generated, as indicated by the broken lines around step 306.

At step 308, a decision is made whether to terminate the programming. The decision at step 308 may be based, e.g., on a predetermined number of pulses and/or on the measured resistance of the antifuse being programmed. If the answer at step 308 is No, control passes back to step 304. The pair of pulses, e.g., pulses 204 and 206, are then repeated at steps 304 and 306. If the answer is Yes, control passes to step 310, and the programming is terminated. If desired a similar decision may be made after step 302 to determine whether to generate a second current limited pulse in step 303. Thus, for example, if after step 302, no conductive filament was formed, the pulse in step 303 is generated. On the other hand, if after step 302, an adequate conductive filament, albeit having a small cross sectional area, is generated, step 303 is skipped and the full current pulse of step 304 is generated with appropriate polarity, i.e., opposite that of the current limited pulse of step 302.

The programming flowchart of FIG. 6 can be implemented using a general purpose computer as will be obvious to those skilled in the art. Namely, microprocessor controlled field programmable gate array programmers for programming antifuses are known in the art. The microprocessors in the programmers are typically driven by software. One skilled in the art can modify such a programmer to supply current pulses in two directions. Further, one skilled in the art can write a software program to implement the methods of FIG. 6.

Figure 7:
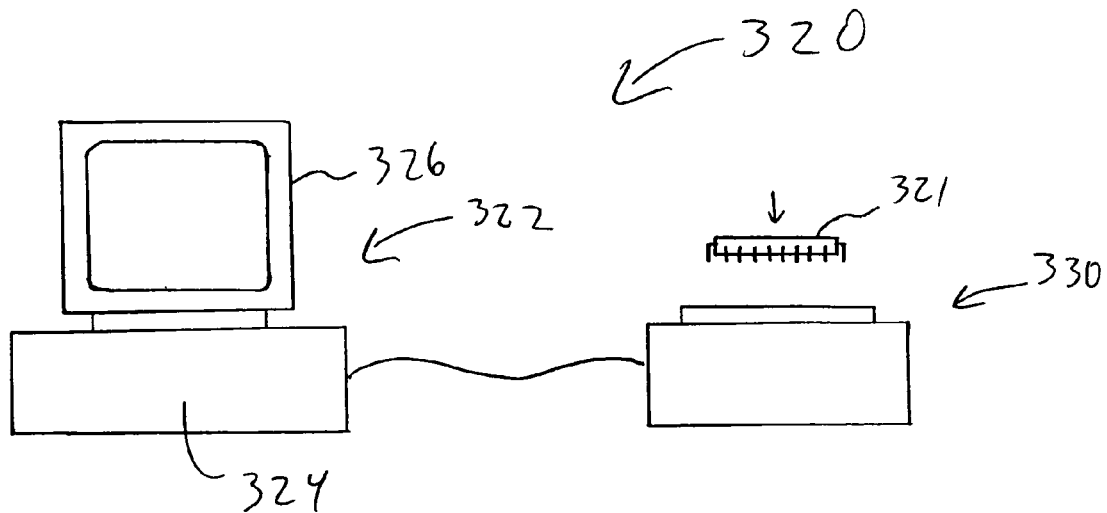
FIG. 7 shows a simplified view of a programming apparatus, which is used to program a programmable device that includes one or more antifuse.

FIG. 7 shows a simplified view of a programming apparatus 320 that is used to program a programmable device 321 that includes one or more antifuses 100. As shown in FIG. 7, programming apparatus 320 includes a computer 322 and a programming unit 330. Computer 322 includes a microprocessor 324 and a monitor 326 and is typically used by the user to map a desired design onto the programmable device 321. Computer 322 may be a conventional personal computer, while programming unit 330 is, for example, a DeskFab™ unit sold by QuickLogic, Inc., located in Sunnyvale, Calif. Computer 322 is shown physically connected to programming unit 330, however, it should be understood that in one embodiment computer 322 and programming unit 330 may be stand alone units and communicate via appropriate memory media, such as floppy disk or CD ROM. A programmable device 321 is shown in FIG. 7, in a side view, being inserted into programming unit 330.

The particular methods used to program a programmable device 321 depends on the type and manufacture of programming device 321. However, the general operation and processes used by programming apparatus 320 to program a programmable device 321 with a users' desired design is well known to those of ordinary skill in the art. For more information related to programming programmable devices see: U.S. Pat. No. 5,552,720, issued Sep. 3, 1996; U.S. Pat. No. 5,544,070, issued Aug. 6, 1996; U.S. Pat. No. 5,661,412 issued Aug. 26, 1997; U.S. Pat. No. 5,526,276, issued Jun. 11, 1996, and U.S. Pat. No. 5,729,468 issued Mar. 17, 1998, all of which are incorporated herein by reference.

Figure 8:
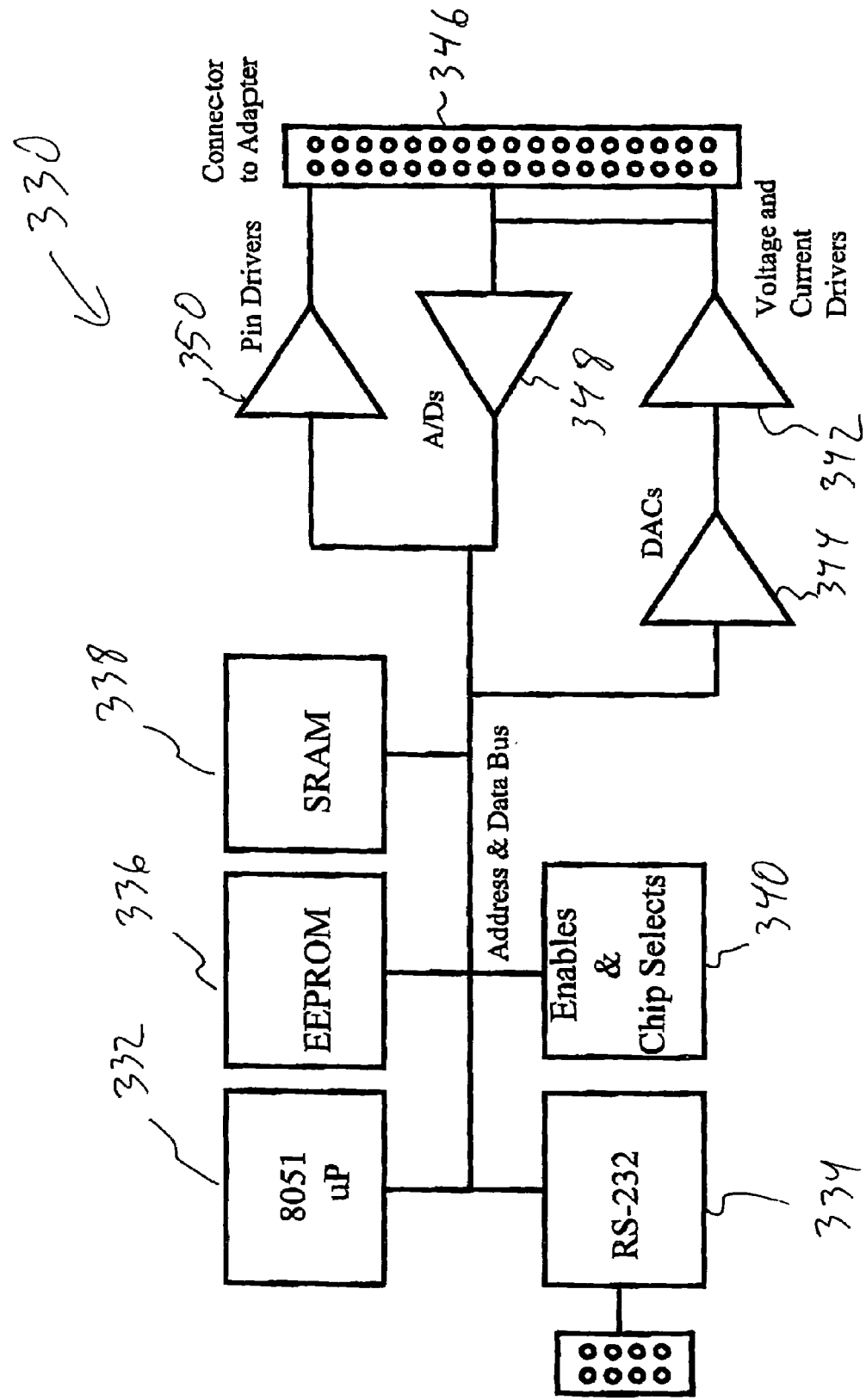
FIG. 8 is a block diagram of a programming unit that may be used to program a programmable device according to the present invention.

FIG. 8 is a block diagram of a programming unit 330 that may be used to program a programmable device 321 according to the method described herein. Programming unit 330 includes a microprocessor 332, such as a 8051 microprocessor manufactured by Intel, which controls all peripherals, including RS-232 334, EEPROM 336, SRAM 338, an enables and chip select unit 340 as well as a voltage and current driver unit 342. The voltage and current driver unit 342 is controlled by microprocessor 332 through a digital to analog converter (DAC) 344. The voltage and current driver unit 342 is coupled to the connector to adapter unit 346, into which the programmable device 321 is inserted. The connector to adapter unit 346 is also coupled to analog to digital converters 348 and pin drivers 350. Microprocessor 332 is used to implement the software stored in EEPROM 336 that implements the method of programming of the present invention.

The operation of programming unit 330 may be conventional with the addition of a current limit for the prepulse 202. To implement the current limit of the prepulse, the voltage to current driver unit 342, for example, may use a current source with a voltage clamp or other appropriate means, e.g., a current limit with a voltage source.

Figure 10:
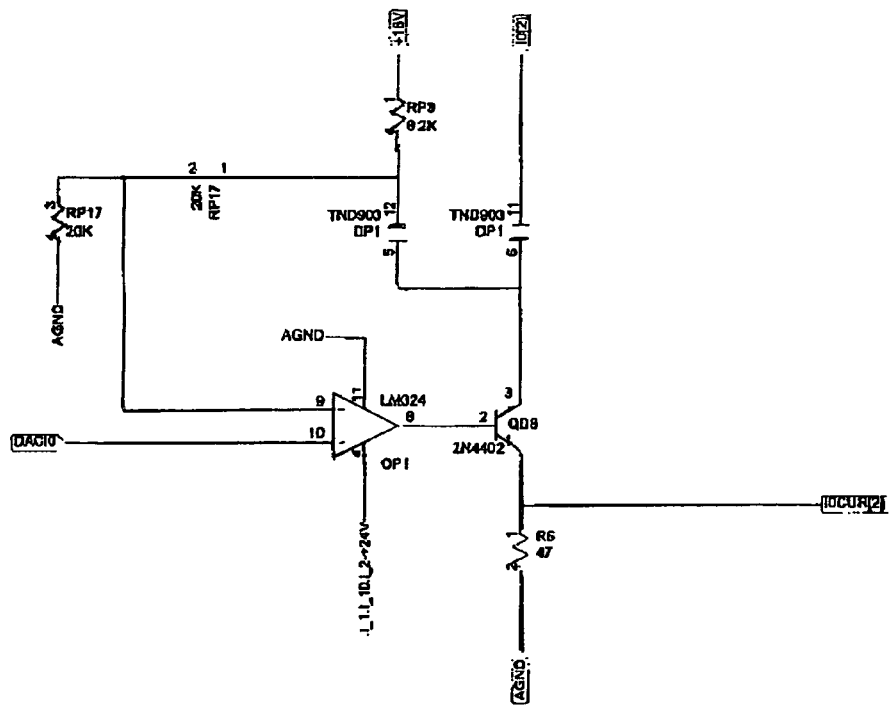
FIG. 10 is a schematic diagram of a voltage clamp that may be used in the voltage to current driver unit of the programming unit of FIG. 8.
Figure 9:
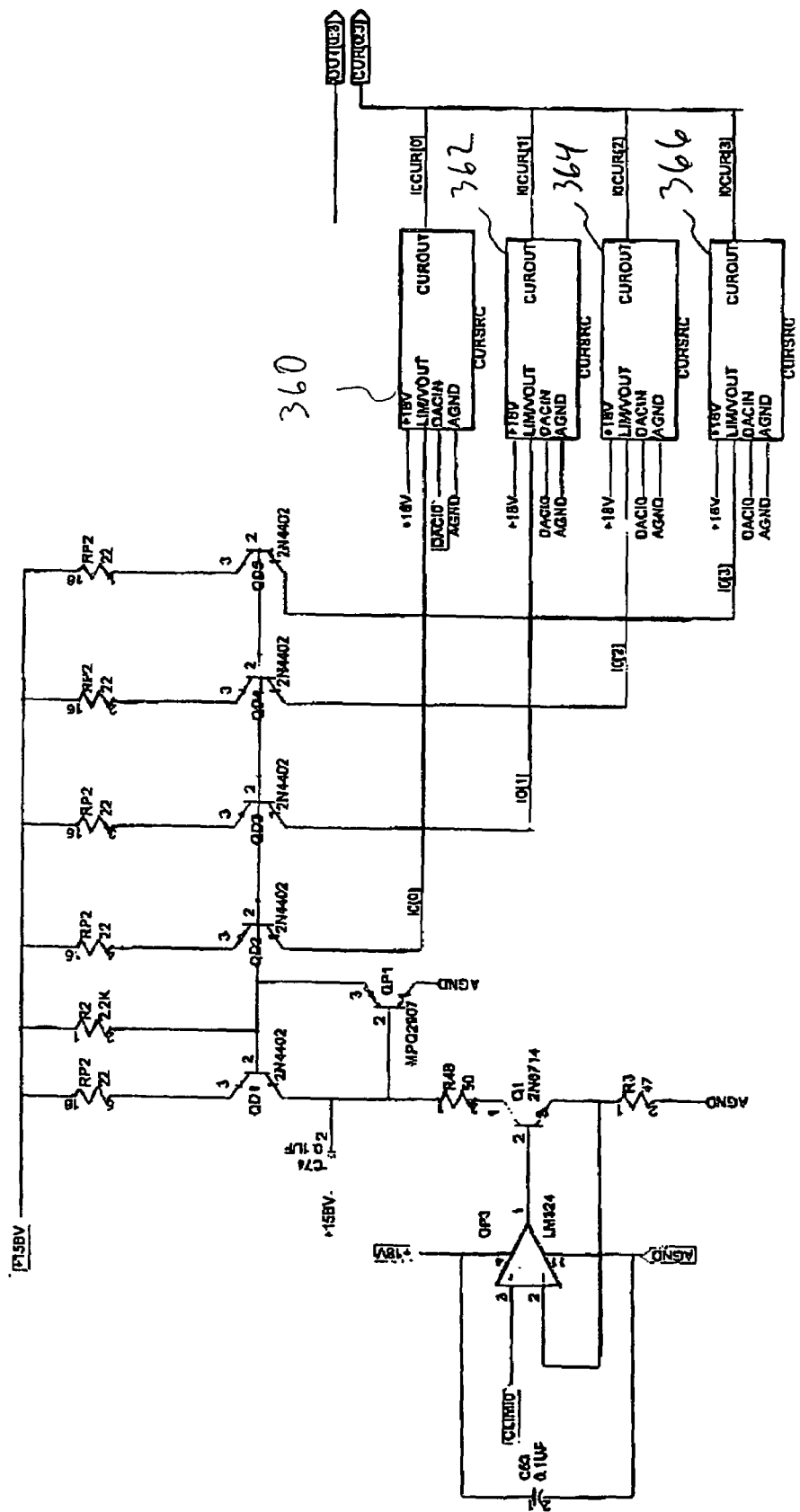
FIG. 9 is a schematic diagram of the current sources in the voltage to current driver unit of the programming unit of FIG. 8.

FIG. 9 is a schematic diagram of the current sources in the voltage to current driver unit 342. As shown in FIG. 9, a current mirror circuit is shown composed of transistors QD1, QD2, QD3, QD4, and QD5. Transistor QD1 is the reference to the four parallel sources QD2–QD5. The reference voltage for the reference transistor QD1 is driven by the voltage follower op amp OP3 and transistor Q1. The input to the op amp OP3 is from DAC 344, shown in FIG. 8. The output current IO[0], IO[1], IO[2], IO[3] from sources QD2, QD3, QD4, and QD5, respectively, are received by voltage clamps 360, 362, 364, and 366. FIG. 10 is a schematic diagram of voltage clamp 364 that may be used with the voltage to current driver unit 342.

While the invention has been described with respect to the embodiments set forth above, other embodiments and variations not described herein are within the scope of the invention. For example, the invention is not limited by the type of the antifuse or by the voltage, current and resistance values. Other embodiments and variations not described herein are to be considered within the scope of the invention, as defined by the following claims.

What is claimed is:

1. A method of programming an antifuse, said antifuse comprising a material that is substantially non-conductive when said antifuse is unprogrammed, said material being disposed between and in electrical contact with a first conductive element and a second conductive element, said method comprising:

passing a first pulse through said material so as to drive material from said first conductive element into said material as a conductive filament, said first pulse is a current limited pulse; and passing a second pulse through said material in the opposite direction of said current limited pulse so as to drive material from said second conductive element into said material thereby increasing the cross sectional area of said conductive filament and reducing the resistance of said antifuse;

wherein the current in said current limited pulse is lower in magnitude than the current in said second pulse, and wherein said current limited pulse is passed through said material prior to any other pulse.

2. The method of claim 1, wherein said current limited pulse and said second pulse have approximately the same voltage with opposite polarity.

3. The method of claim 1, wherein said current in said current limited pulse is 20 to 33 percent lower in magnitude than said current in said second pulse.

4. The method of claim 1,
wherein passing said current limited pulse through said material comprises applying a first voltage to said first conductive element and applying a second voltage to said second conductive element, said second voltage being greater in magnitude than said first voltage, and limiting the current to a desired magnitude; and
wherein passing said second pulse through said material comprises applying said second voltage to said first conductive element and applying said first voltage to said second conductive element.

5. The method of claim 1, wherein said material comprises amorphous silicon and said conductive filament comprises silicide.

6. The method of claim 1, further comprising passing a plurality of current limited pulses through said material prior to passing said second pulse through said material.

7. The method of claim 6, wherein passing said plurality of current limited pulses through said material comprises passing at least two current limited pulses through said material, said at least two current limited pulses being opposite in polarity.

8. A method of programming an antifuse, said antifuse comprising a material that is substantially non-conductive when said antifuse is unprogrammed, said material being disposed between and in electrical contact with a first conductive element and a second conductive element, said method comprising:
passing a current limited pulse through said material so as to drive material from said first conductive element into said material as a conductive filament;
passing a second pulse through said material in the opposite direction of said current limited pulse so as to drive material from said second conductive element into said material thereby increasing the cross sectional area of said conductive filament and reducing the resistance of said antifuse; and
passing a third pulse through said material in the same direction as the current limited pulse, said third pulse being greater in magnitude than said current limited pulse, said third pulse further reducing the resistance of said antifuse,
wherein the current in said current limited pulse is lower in magnitude than the current in said second pulse, and wherein said current limited pulse is passed through said material prior any non-current limited pulse.

9. A method of programming an antifuse, said antifuse comprising a material that is substantially non-conductive when said antifuse is unprogrammed, said material being disposed between and in electrical contact with a first conductive element and a second conductive element, said method comprising:
applying a prepulse to said material, said prepulse having a current of a first magnitude that drives material from said first conductive element into said material as a conductive filament; and applying a programming pulse to said material, said programming pulse having a current of a second magnitude that drives material from said second conductive element into said material adding to said conductive filament;
wherein said current of said first magnitude is lower than said current of said second magnitude, and wherein said prepulse is applied prior to applying any programming pulses.

10. The method of claim 9, wherein said current of said second magnitude is 20 to 33 percent greater in magnitude than said current of said first magnitude.

11. The method of claim 9,
wherein said prepulse has a first voltage applied to said first conductive element and a second voltage applied to said second conductive element; and
wherein said first programming pulse has said second voltage applied to said first conductive element and said first voltage applied to said second conductive element.

12. The method of claim 9, wherein said current of said programming pulse is applied in the opposite direction of said current of said prepulse.

13. The method of claim 12, further comprising applying a second programming pulse to said material, said second programming pulse having a current of a third magnitude, said current of said second programming pulse being applied in the same direction of said current of said prepulse.

14. The method of claim 13, wherein said third magnitude is not greater than said second magnitude.

15. The method of claim 13, wherein said third magnitude is greater than said second magnitude.

16. The method of claim 13, further comprising repeatedly applying said first programming pulse and said second programming pulse a predetermined number of times.

17. The method of claim 13, further comprising repeatedly applying said first programming pulse and said second programming pulse until the resistance of said antifuse is below a predetermined value.

18. The method of claim 9, further comprising applying at least one additional prepulse to said material prior to applying said programming pulse.

19. A method of programming an antifuse, said antifuse comprising a material that is substantially non-conductive when said antifuse is unprogrammed, said material being disposed between and in electrical contact with a first conductive element and a second conductive element, said method comprising:
applying a prepulse to said material, said prepulse having a current of a first magnitude that drives material from said first conductive element into said material as a conductive filament; and
applying a second prepulse to said material after said applying said first prepulse to said material, wherein said second prepulse has said current of a third magnitude;
applying a programming pulse to said material, said programming pulse having a current of a second magnitude that drives material from said second conductive element into said material adding to said conductive filament;
wherein said current of said first magnitude is lower than said current of said second magnitude, and wherein said prepulse is applied prior to applying said programming pulses;
wherein said current of said third magnitude is lower than said current of said second magnitude, wherein said current of said third magnitude has an opposite polarity from said current of said first magnitude, and wherein said second prepulse is applied prior to applying said programming pulse; and wherein said first prepulse has approximately the same voltage with opposite polarity as said second prepulse.

20. The method of claim 19, wherein said third magnitude is approximately equal to or greater than said first magnitude.

21. A method of programming an antifuse, said antifuse comprising a material that is substantially non-conductive when said antifuse is unprogrammed, said method comprising:

applying a first voltage across said material and a first current through said material, said first current driving a conductive filament with a first cross sectional area through said material; and applying a second voltage across said material and a second current through said material, said second voltage having the same magnitude and opposite polarity as said first voltage, said second current having a greater magnitude and opposite polarity as said first current, said second current increasing the size of said conductive filament to a second cross sectional area, said second cross sectional area being greater than said first cross sectional area;

wherein said first current having insufficient magnitude to produce a conductive filament with said second cross sectional area, and wherein said first current is applied through said material prior to any current which has sufficient magnitude to produce a conductive filament with said second cross sectional area.

22. A method of programming an antifuse, said antifuse comprising a material that is substantially non-conductive when said antifuse is unprogrammed, said method comprising:

applying at least one prepulse to said material, said prepulse including a first current to drive a conductive filament through said material, said first current having insufficient magnitude to produce said conductive filament with a desired resistance; and applying at least one programming pulse to said material after the application of said at least one prepulse, said programming pulse including a second current having a greater magnitude than said first current to increase the cross sectional area of said conductive filament and to decrease the resistance of said conductive filament to a desired resistance, wherein said prepulse is applied prior to the application of any programming pulses.

23. The method of claim 22, wherein said prepulse and said programming pulse have the same magnitude voltages with opposite polarities.

24. The method of claim 22, further comprising applying at least one additional prepulse to said material wherein said at least one prepulse and said at least one additional prepulse define a plurality of prepulses.

25. The method of claim 24, wherein said plurality of prepulses have currents of approximately the same magnitudes with each prepulse having a current of an opposite polarity from an immediately preceding prepulse.

* * * * *